(12) United States Patent
Roy

(10) Patent No.: US 7,279,729 B2
(45) Date of Patent: Oct. 9, 2007

(54) PHOTODETECTOR ARRAY

(75) Inventor: François Roy, Seyssins (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/849,094

(22) Filed: May 19, 2004

(65) Prior Publication Data

US 2004/0238911 A1    Dec. 2, 2004

(30) Foreign Application Priority Data

May 26, 2003  (FR) .................................. 03 06343

(51) Int. Cl.
*H01L 31/113*    (2006.01)
(52) U.S. Cl. ...................... 257/291; 257/292; 257/444; 257/E27.133
(58) Field of Classification Search ........ 257/290–294, 257/443, 444, 446, 449, 453, 458, E31.061, 257/E31.065, E27.133, E27.141; 250/214 R, 250/208.1
See application file for complete search history.

(56) References Cited

U.S. PATENT DOCUMENTS

| | | | |
|---|---|---|---|
| 5,557,121 A | 9/1996 | Kozuka et al. | |
| 5,936,261 A | 8/1999 | Ma et al. | |
| 6,051,867 A | 4/2000 | Theil et al. | |
| 6,215,164 B1 | 4/2001 | Cao et al. | |
| 6,325,977 B1* | 12/2001 | Theil ........................ | 422/82.05 |
| 6,501,065 B1* | 12/2002 | Uppal et al. ............. | 250/214.1 |
| 6,720,594 B2* | 4/2004 | Rahn et al. ................. | 257/291 |
| 6,841,411 B1* | 1/2005 | Varghese ..................... | 438/94 |

FOREIGN PATENT DOCUMENTS

WO    WO98 47181 A    10/1998

OTHER PUBLICATIONS

French Search Report from French Patent Application 03/06343, filed May 26, 2003.

* cited by examiner

*Primary Examiner*—Minh-Loan Tran
(74) *Attorney, Agent, or Firm*—Lisa K. Jorgenson; James H. Morris; Wolf, Greenfield & Sacks, P.C.

(57) ABSTRACT

A photodetector array made in monolithic form, in which transistors are formed in a semiconductor substrate coated with several metallization levels and photodiodes are formed above a last metallization level, each photodiode having an upper region of a first conductivity type common to all photodiodes and an individual lower region forming a junction with the upper region in contact with a metallization of the last level, wherein each lower region is separated from the neighboring lower regions by an insulating material and is connected to the metallization through a via formed in at least one insulating layer.

23 Claims, 2 Drawing Sheets

PHOTODETECTOR ARRAY

BACKGROUND OF THE INVENTION

1. Field of the Invention

The present invention relates to photodetector arrays intended to be used as image sensors in imaging devices such as, for example, video cameras or digital photographic devices. More specifically, the present invention relates to such arrays made in monolithic form.

2. Discussion of the Related Art

FIG. 1 illustrates a circuit diagram of a portion of an elementary cell 1 of a photodetector array. Cell 1 includes a photodiode D having its anode connected to a low reference supply line VSS. The cathode of diode D is connected to a precharge and detection terminal K. Terminal K is connected to a high supply line VDD via a precharge MOS transistor 3 having its gate receiving a precharge control signal RESET. Terminal K is also connected to the gate of a MOS transfer transistor 5 interposed between high power supply VDD and the drain of a read control transistor 7. The source of transistor 7 forms output terminal OUT of cell 1 and its gate receives a read control signal READ.

A technology in which at least transistors 3, 5, and 7 of cell 1 are formed in an integrated circuit coated with metallization levels, photodiode D being formed above the last metallization level, is considered in the present description.

FIG. 2 partially and schematically illustrates a known integration mode of some of the elements of FIG. 1.

Transistors 3 and 5 are formed in a semiconductor substrate 10, typically single-crystal silicon, generally of type P. More specifically, each transistor 3, 5 is formed in an active area of substrate 10 defined, for example, by insulating trenches 11. For each transistor 3, 5, a channel region, defined by a respective insulated gate 12 laid on substrate 10, separates N-type source/drain regions 14 formed in substrate 10. Above substrate 10 are superposed intermediary metallization levels generally referred to as IML. Levels IML comprise metallizations embedded in at least one insulating material and intended, in particular, to form terminal K and transfer a contact in the form of a metal plate 18 from a last metallization level to above an upper insulating layer 16.

A cathode 20 of a photodiode D encapsulates plate 18. Cathode 20 results from a low-temperature deposition, on the order of 2000° C. Cathode 20 is, for example, made of N-type doped amorphous silicon. The cathode 20 of each photodiode D is individualized and separate from the cathodes of the photodiodes of the neighboring cells. The anode of diode D is common to several photodiodes, generally at least to all photodiodes in a row or column of the array. The common anode is formed of a stacking of an undoped amorphous silicon layer 22 and of a P-type doped upper layer 24. Layer 24 is covered with a transparent ITO-type metal layer 26 intended, for example, to be connected to low power supply VSS.

A disadvantage of the preceding structure is the fact that the restored image exhibits white points or darkness defects. Such a malfunction is linked to the creation of leakage currents between regions 20 and 22, especially when the distance between cathodes is reduced and the cathodes are at their maximum biasing level, generally ranging between 1.5 and 2 V.

To overcome such malfunctions, and thus suppress short-circuits, it has been provided to increase the dimensions of the interval separating two cathodes with respect to their minimum values determined by the electric and geometric characteristics (doping and thicknesses) of the electrodes. This solution is contrary to the general goal of increasing the number of cells formed in a given integration surface.

SUMMARY OF THE INVENTION

An object of the present invention is to provide a structure that exhibits an increased density.

An object of the present invention is to provide such a structure that does not exhibit the drawbacks of existing structures.

Another object of the present invention is to provide a method for manufacturing such a structure.

To achieve these and other objects, the present invention provides a photodetector array made in monolithic form, in which transistors are formed in a semiconductor substrate coated with several metallization levels and photodiodes are formed above a last metallization level, each photodiode comprising an upper region of a first conductivity type common to all photodiodes and an individual lower region forming a junction with the upper region in contact with a metallization of the last level, each lower region being separated from the neighboring lower regions by an insulating material and being connected to the metallization via a via formed in at least one insulating layer.

According to an embodiment of the present invention, the lower region is made of N-type doped amorphous silicon.

According to an embodiment of the present invention, the lower region is made of a metallic material capable of forming a Schottky junction with the upper region.

According to an embodiment of the present invention, the lower region is made of chromium.

According to an embodiment of the present invention, the at least one insulating layer comprises a silicon oxide layer and a silicon nitride layer.

According to an embodiment of the present invention, the upper region is an undoped amorphous silicon region.

According to an embodiment of the present invention, the upper region is covered with a P-type doped amorphous silicon layer.

According to an embodiment of the present invention, the upper region is covered with a transparent metal layer.

According to an embodiment of the present invention, the insulating material separating two neighboring lower regions is silicon oxide.

The present invention also provides a method for forming a photodiode of a photodetector array above a last metallization level of an integrated circuit, transistors of the array being formed in a semiconductor substrate and intermediary metallization levels superposed to the substrate, comprising the steps of:

forming on the last metallization level a metal plate embedded in an insulating material and contacting terminals of some of the transistors;

depositing at least one insulating layer so that its upper surface is substantially planar;

depositing and etching an insulating material to expose the upper insulating layer according to the contour of a lower region of the photodiode;

opening the exposed portions of the upper insulating layer, then opening the lower insulating layer to partially expose the plate;

depositing between and on the portions maintained in place of the insulating material a material capable of forming the first region;

performing a chem.-mech polishing to expose the upper surface of the portions; and depositing a semiconductor material capable of forming an upper region of the photodiode.

The foregoing objects, features, and advantages of the present invention will be discussed in detail in the following non-limiting description of specific embodiments in connection with the accompanying drawings.

DETAILED DESCRIPTION

Figure 1:
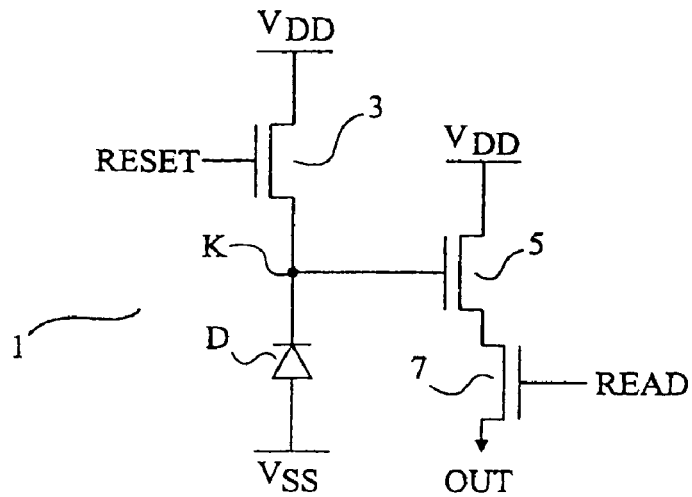
FIG. 1, previously described, illustrates the skeleton diagram of a portion of an elementary cell of a photodetector array.
Figure 2:
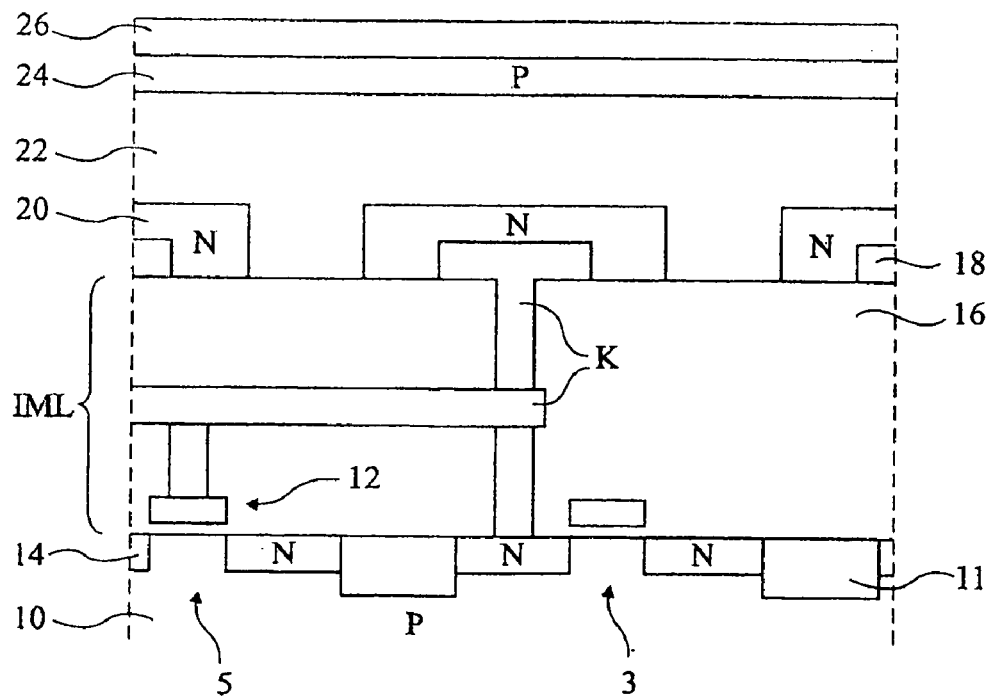
FIG. 2, previously described, illustrates in partial simplified cross-section view a known integration mode of a photodetector array.
Figure 3:
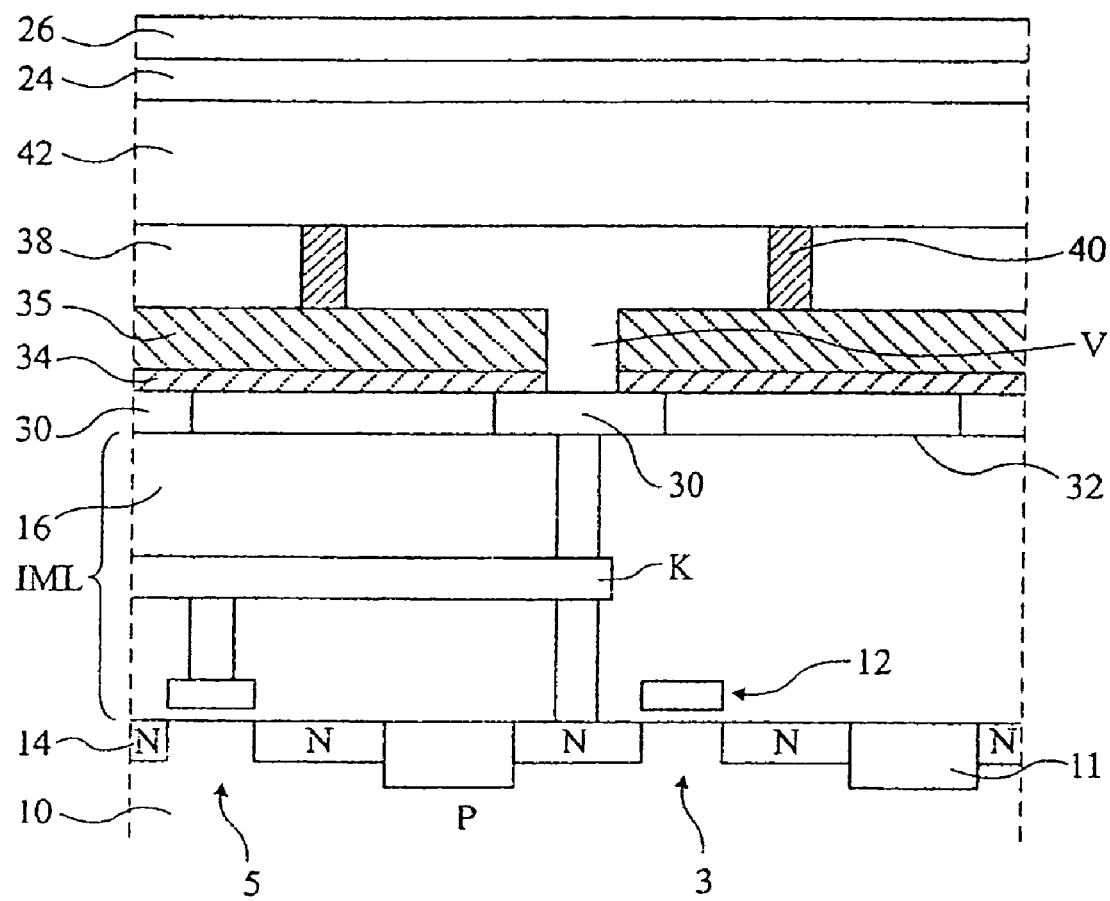
FIG. 3 illustrates in partial simplified cross-section view an integrated photodetector array according to an embodiment of the present invention.

For clarity, the same elements have been designated with the same reference numerals in the different drawings and further, as usual in the representation of integrated circuits, the cross-section views of FIGS. 2 and 3 are not drawn to scale. For simplification, only those elements necessary to the understanding of the present invention have been shown or described. In particular, the structures of transistors 3, 5, and 7 of FIG. 1 and of the intermediary metallization levels are not described in detail, nor shown in detail in FIGS. 2 and 3.

FIG. 3 is a partial simplified cross-section view of an integration mode according to the present invention of a photodetector array. The cross-section view of FIG. 3 is centered on an elementary cell similar to cell 1 of FIG. 1. For simplification, only the difference between FIGS. 2 and 3, that is, the structure portion formed above insulating layer 16, are described hereafter.

The last metallization level comprises separate metal plates 30 separated by portions of an insulating layer 32. Each plate 30 corresponds to a terminal K of a respective elementary cell. The upper surface of plates 30 and of layer 32 is substantially planar and is covered with at least one insulating layer, for example, two successive insulating layers 34 and 35. Lower insulating layer 34 is, preferably, selectively etchable with respect to insulating layer 32. Upper layer 35 is, preferably, selectively etchable with respect to lower layer 34. For example, layer 34 is a silicon oxide layer ($SiO_2$), while upper layer 35 is a silicon nitride layer ($Si_3N_4$). The upper surface of upper layer 35 is substantially planar. Layer 35 supports individual cathodes 38 of photodiodes D of the array. Cathodes 38 are formed, for example, of N-type doped amorphous silicon deposited at low temperature (on the order of 200° C.). Each cathode 38 is in contact with a respective plate 30, by means of a conductive via V formed in insulating layers 35 and 34.

The interval between two cathodes 38 is filled with an insulating material 40. The upper surface of cathodes 38 and of intermediary filling layer 40 is substantially planar. An anode layer 42 covers cathodes 38 and their insulating separation 40 altogether. Layer 42, intended to form the common anode of photodiodes, is covered with a semiconductor layer 24 coated with a transparent metal layer 26.

Anode layer 42 is for example made of undoped amorphous silicon while semiconductor layer 24 is made of P-type doped amorphous silicon.

The interval between two cathodes 38, that is, the interval filled with insulating material 40, may advantageously be reduced to the minimum theoretically sufficient to enable stable insulation of neighboring cathodes 38. This minimum is determined by the maximum bias level of the cathodes, their conductivity (doping), and the value of the dielectric constant of insulator 40.

The resulting array exhibits reduced malfunction rates as compared to known structures. Indeed, the elimination of the portions of the undoped anode layer separating two cathodes eliminates a significant source of malfunctions.

Further, this enables increasing the cell density of an array, since the interval between two photocathodes 38 of the structure of FIG. 3 is reduced with respect to the homologous interval between two photocathodes 20 of FIG. 2.

Another advantage of the present invention is that one or several passivation layers may cover last metallization level 30-32. These layers may be maintained in place and vias V also cross them. Conversely, in conventional arrays, these layers are not formed. The present invention then eliminates malfunctions due to a handling of the circuits while the upper metallizations are apparent.

The structure of FIG. 3 may be obtained, for example, by the following method. After defining metal plates 30, an insulating layer 32 is deposited and flattened, for example, by a chem.-mech polishing (CMP), to expose the upper surface of plates 30. Lower insulating layer 34 is then deposited According to an alternative, layers 32 and 34 being of same nature, a single insulating layer intended to embed metal plates 30 is deposited after definition of plates 30.

According to another alternative, plates 30 are formed according to a damascene-type method, insulating layer 32 being deposited, then opened, according to the pattern of plates 30 before depositing a metal, then performing a CMP polishing to expose the portions of layer 32 maintained in place.

The method carries on with the deposition of insulating layer 35. Then, an insulating layer 40 may be deposited, then opened, according to the pattern which is desired to be given to cathodes 38. Then, the stacking of insulating layers 35 and 34 (or 35 and 32) is opened to expose plates 30. A layer capable of forming vias V and cathodes 38 such as, for example, amorphous silicon, is then deposited. Finally, the structure is leveled, for example, by means of a CMP. The structure is then completed by successive depositions of regions 42, 24, and 26.

An advantage of such a method is the CMP performed before forming of anode 42. In addition to the previously-described advantages, this enables obtaining a regular interface between the cathodes and the anode. This further reduces array malfunctions.

Of course, the present invention is likely to have various alterations, modifications, and improvements which will readily occur to those skilled in the art. In particular, it will be within the abilities of those skilled in the art to adapt the materials used to a given technological line. Thus, the present invention has been described in the case of cathodes formed of N-type doped amorphous silicon. However, the cathodes may be made of a metal capable of forming a Schottky-type junction with the anode, such as, for example, chromium.

Similarly, it has been considered that vias V are formed of the material forming cathodes 38. However, they may be formed of a different material, deposited, then etched before forming of cathodes 38.

Further, it has been previously indicated that the value of the interval between two cathodes 38 depends on the geometric and electric characteristics of the cathodes and on insulating material 40. However, it should be clear to those skilled in the art that it also depends on the etch possibilities of material 40, when said material is deposited before forming of cathodes 38. Conversely, if cathodes 38 are formed (individualized) and material 40 deposited afterwards, the interval then depends on the possibilities of etching the material forming cathodes 38 and of deposition of material 40.

It should moreover be noted that "substrate" has been used to designate uniformly-doped semiconductor wafers as well as epitaxial areas and/or areas specifically doped by diffusion/implantation formed on or in a solid substrate. Further, it will be within the abilities of those skilled in the art to complete the previously-described structure with any element necessary to the general device operation. In particular, it will be within the abilities of those skilled in the art to form transistor 7 of FIG. 1 and various sources capable of providing supply signals VDD, VSS or control signals RESET, READ. Similarly, the real structure of intermediary metallization levels IML has not been detailed. It will be within the abilities of those skilled in the art to form in these levels any necessary connection between different elements formed in the substrate.

It will be within the abilities of those skilled in the art to adapt the present invention to the desired application. Thus, the present invention is not limited to arrays comprising the base structure of FIG. 1, but applies to any photosensor array using photodiodes formed above a last metallization level of an integrated circuit. In particular, the number of elements other than the photodiode such as transistors 3, 5, and 7 forming an elementary cell or pixel may be greater or smaller.

It will also be within the abilities of those skilled in the art to adapt the materials of the various conductive and/or insulating layers according to a used manufacturing line.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photodetector array made in monolithic form, in which transistors are formed in a semiconductor substrate coated with a metallization level and photodiodes are formed above the metallization level, each photodiode comprising an upper region of a first conductivity type common to all photodiodes and a lower region forming a junction with the upper region, said lower region being in contact with a metallization formed in the metallization level, the metallization being separated from adjacent metallizations by a portion of a first insulating layer, wherein each lower region is separated from neighboring lower regions by at least one second insulating layer and is connected to the metallization by a portion of the lower region that extends through a via formed in the at least one second insulating layer.

2. The photodetector array of claim 1, wherein the lower region is made of N-type doped amorphous silicon.

3. The photodetector array of claim 1, wherein the lower region is made of a metallic material capable of forming a Schottky junction with the upper region.

4. The photodetector array of claim 3, wherein the lower region is made of chromium.

5. The photodetector array of claim 1, wherein said at least one second insulating layer comprises a silicon oxide layer and a silicon nitride layer.

6. The photodetector array of claim 1, wherein the upper region is an undoped amorphous silicon region.

7. The photodetector array of claim 1, wherein the upper region is covered with a P-type doped amorphous silicon layer.

8. The photodetector array of claim 1, wherein the upper region is covered with a transparent metal layer.

9. The photodetector array of claim 1, further comprising a region of insulating material separating two neighboring lower regions, the region of insulating material being above the at least one second insulating layer, wherein the region of insulating material comprises silicon oxide.

10. A photodetector, comprising:
a first metallization formed in a first metallization layer;
a second metallization formed in the first metallization layer;
a first insulating region that separates the first metallization from the second metallization;
at least one insulating layer; and
a first photodiode comprising:
a first region of a first conductivity type that extends through a gap in the at least one insulating layer and contacts the first metallization; and
a second region of a second conductivity type that contacts the first region and which is shared by a second photodiode; wherein the second phododiode comprises:
a third region of the first conductivity type that extends through a gap in the at least one insulating layer and contacts the second metallization.

11. The photodetector of claim 10, wherein the first conductivity type is type N.

12. The photodetector of claim 10, wherein the second conductivity type comprises an intrinsic conductivity type.

13. The photodetector of claim 10, wherein the at least one insulating layer comprises at least two regions of different materials.

14. The photodetector of claim 13, wherein the at least one insulating layer comprises a layer of silicon dioxide and a layer of silicon nitride.

15. The photodetector of claim 10, wherein the at least one insulating layer comprises a layer of silicon dioxide.

16. The photodetector of claim 10, wherein the at least one insulating layer comprises a layer of silicon nitride.

17. The photodetector of claim 10, further comprising:
a fourth region of a third conductivity type that contacts the second region.

18. The photodetector of claim 17, wherein the fourth conductivity type comprises type P.

19. The photodetector of claim 10, further comprising a region of conductive transparent oxide disposed above the second region.

20. The photodetector of claim 10, further comprising a second insulating region that separates the first region from the third region, wherein the second insulating region is above the at least one insulating layer.

21. The photodetector of claim 10, wherein the gap in the at least one insulating layer comprises a via through which the portion of the first region extends.

22. The photodetector of claim 21, wherein the via does not extend beyond an area of the first metallization.

23. The photodetector of claim 10, wherein a majority of the first region is disposed on a first side of the at least one insulating layer and makes contact with the first metallization on a second side of the at least one insulating layer.

* * * * *

UNITED STATES PATENT AND TRADEMARK OFFICE
CERTIFICATE OF CORRECTION

PATENT NO. : 7,279,729 B2  
APPLICATION NO. : 10/849094  
DATED : October 9, 2007  
INVENTOR(S) : François Roy It is certified that error appears in the above-identified patent and that said Letters Patent is hereby corrected as shown below:

Col. 1, line 47, should read:  
on the order of 200°C. Cathode 20 is, for example, made of Signed and Sealed this Eighteenth Day of December, 2007

JON W. DUDAS  
*Director of the United States Patent and Trademark Office*